(12) United States Patent
Aksyuk et al.

(10) Patent No.: US 8,154,378 B2
(45) Date of Patent: Apr. 10, 2012

(54) THERMAL ACTUATOR FOR A MEMS-BASED RELAY SWITCH

(75) Inventors: Validmir Anatolyevich Aksyuk, Westfield, NJ (US); Flavio Pardo, New Providence, NJ (US); Maria Elina Simon, New Providence, NJ (US)

(73) Assignee: Alcatel Lucent, Paris (FR)

( * ) Notice: Subject to any disclaimer, the term of this patent is extended or adjusted under 35 U.S.C. 154(b) by 351 days.

(21) Appl. No.: 11/836,860

(22) Filed: Aug. 10, 2007

(65) Prior Publication Data

US 2009/0040008 A1  Feb. 12, 2009

(51) Int. Cl.
  *H01H 61/00* (2006.01)
  *H01H 71/16* (2006.01)
  *H01H 71/18* (2006.01)
  *H01H 61/02* (2006.01)
  *F01B 29/10* (2006.01)
  *F02G 1/04* (2006.01)

(52) U.S. Cl. ............... 337/365; 337/36; 337/53; 337/89; 337/123; 337/139; 337/141; 60/528; 60/529

(58) Field of Classification Search .................. 337/333, 337/36, 53, 89, 365, 123, 139, 141; 60/528, 60/529
See application file for complete search history.

(56) References Cited

U.S. PATENT DOCUMENTS

| | | | |
|---|---|---|---|
| 5,796,152 A * | 8/1998 | Carr et al. ............... | 257/415 |
| 6,211,598 B1 * | 4/2001 | Dhuler et al. ............ | 310/307 |
| 6,333,583 B1 * | 12/2001 | Mahadevan et al. ...... | 310/306 |
| 6,407,478 B1 * | 6/2002 | Wood et al. ............. | 310/307 |
| 6,410,361 B2 * | 6/2002 | Dhuler et al. ............ | 438/54 |
| 6,428,173 B1 * | 8/2002 | Dhuler et al. ............ | 359/872 |
| 6,679,055 B1 * | 1/2004 | Ellis ..................... | 60/527 |
| 6,685,303 B1 * | 2/2004 | Trauernicht et al. ...... | 347/54 |
| 6,691,513 B1 * | 2/2004 | Kolesar ................. | 60/527 |
| 6,739,132 B2 * | 5/2004 | Bromley et al. .......... | 60/527 |
| 6,882,264 B2 * | 4/2005 | Cunningham ........... | 337/139 |

(Continued)

FOREIGN PATENT DOCUMENTS
WO  WO 2007/138266 A1  12/2007

OTHER PUBLICATIONS

"A Latching MEMS Relay for DC and FR Applications," by Vivek Agrawal, Memscap Inc., Research Triangle Park, NC, USA, ISBN: 0-7803-8460-1, IEEE, Sep. 20-23, 2004, pp. 222-225.

*Primary Examiner* — Bradley Thomas
(74) *Attorney, Agent, or Firm* — Mendelsohn, Drucker & Associates, P.C.

(57) ABSTRACT

A representative embodiment of the invention provides a thermal actuator for a MEMS-based relay switch. The thermal actuator has an "active" arm that is movably mounted on a substrate. The "active" arm has (i) a thermal expansion layer and (ii) a resistive heater that is electrically isolated from the thermal expansion layer. The thermal expansion layer is adapted to expand in response to a temperature change induced by a control current flowing through the resistive heater, thereby bending the "active" arm and moving that arm with respect to the substrate. Due to the fact that mechanical and electrical characteristics of the "active" arm are primarily controlled by the thermal expansion layer and the resistive heater, respectively, those characteristics can be optimized independently to obtain better operating characteristics for MEMS-based relay switches of the invention compared to those attained in the prior art.

21 Claims, 7 Drawing Sheets

U.S. PATENT DOCUMENTS

| | | | |
|---|---|---|---|
| 7,006,376 B2* | 2/2006 | Kozicki | 365/185.01 |
| 7,036,312 B2* | 5/2006 | Menard et al. | 60/527 |
| 7,782,170 B2* | 8/2010 | Robert | 337/85 |
| 2002/0021053 A1 | 2/2002 | Wood et al. | 310/306 |
| 2003/0200749 A1 | 10/2003 | Bromley et al. | 60/527 |
| 2004/0080239 A1* | 4/2004 | Gupta et al. | 310/307 |
| 2004/0155917 A1* | 8/2004 | Trauernicht et al. | 347/19 |
| 2004/0207498 A1* | 10/2004 | Hyman et al. | 335/78 |
| 2004/0211178 A1* | 10/2004 | Menard et al. | 60/527 |
| 2004/0263573 A1* | 12/2004 | Cabal et al. | 347/54 |
| 2005/0039453 A1* | 2/2005 | Silverbrook | 60/527 |
| 2005/0046672 A1* | 3/2005 | Cabal et al. | 347/54 |
| 2005/0146404 A1* | 7/2005 | Yeatman | 335/78 |
| 2005/0189204 A1* | 9/2005 | Yeatman et al. | 200/181 |
| 2005/0279090 A1* | 12/2005 | Silverbrook | 60/527 |
| 2006/0109075 A1* | 5/2006 | Cabal et al. | 337/333 |
| 2006/0221430 A1* | 10/2006 | Zhu et al. | 359/290 |
| 2006/0238279 A1* | 10/2006 | Lu et al. | 335/78 |
| 2007/0103029 A1* | 5/2007 | Fedder et al. | 310/307 |
| 2007/0163255 A1 | 7/2007 | Rubel | 60/527 |
| 2007/0170811 A1* | 7/2007 | Rubel | 310/307 |

* cited by examiner

100

100

200

200

200

200

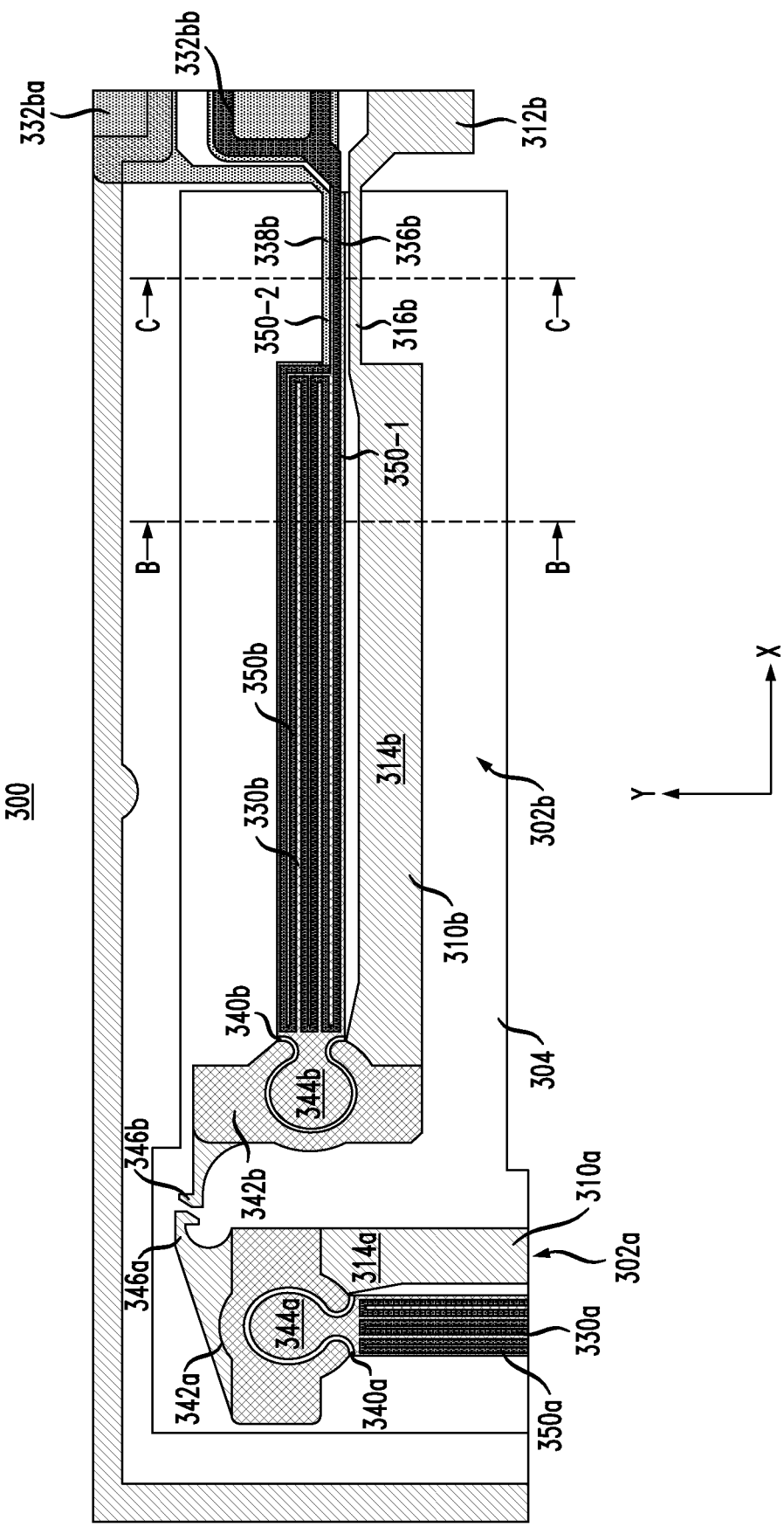

400

400

400

400

400

THERMAL ACTUATOR FOR A MEMS-BASED RELAY SWITCH

BACKGROUND OF THE INVENTION

1. Field of the Invention

The present invention relates to micro-electromechanical systems (MEMS) and, more specifically, to MEMS-based relays for direct-current (DC) and radio-frequency (RF) electrical cross-connects.

2. Description of the Related Art

MEMS-based relays serve as a viable alternative to conventional mechanical relays. More specifically, MEMS-based relays are more compact and more cost effective than conventional mechanical relays. For RF applications, MEMS-based relays offer relatively low series resistance, substantially no power consumption in ON and OFF states, and relatively low intermodulation distortion compared to that, e.g., in field-effect-transistor (FET)-based relays. As a result, MEMS-based relays using electrical, magnetic, or thermal actuation, with both mono-stable and bi-stable designs are being actively developed.

SUMMARY OF THE INVENTION

A representative embodiment of the invention provides a thermal actuator for a MEMS-based relay switch. The thermal actuator has an "active" arm that is movably mounted on a substrate. The "active" arm has (i) a thermal expansion layer and (ii) a resistive heater that is electrically isolated from the thermal expansion layer. The thermal expansion layer is adapted to expand in response to a temperature change induced by a control current flowing through the resistive heater, thereby bending the "active" arm and moving that arm with respect to the substrate. Due to the fact that mechanical and electrical characteristics of the "active" arm are primarily controlled by the thermal expansion layer and the resistive heater, respectively, those characteristics can be optimized independently to obtain better operating characteristics for MEMS-based relay switches of the invention compared to those attained in the prior art.

According to one embodiment, a device of the invention comprises first and second arms movably supported on a substrate. A first end of each of the first and second arms is attached to a respective anchor affixed to the substrate. Second ends of the first and second arms are mechanically connected to one another. The first arm comprises (i) a first thermal expansion layer and (ii) a first resistive heater that is different from the first the first thermal expansion layer. The first resistive heater is adapted to increase temperature of the first thermal expansion layer in response to a first electrical current driven through the first resistive heater. The first thermal expansion layer is adapted to expand in response to the temperature increase induced by the first resistive heater and move the second ends of the first and second arms with respect to the substrate due to said expansion of the first thermal expansion layer.

According to another embodiment, a method of the invention comprises driving a first electrical current through a first resistive heater of a device. The device comprises first and second arms movably supported on a substrate. A first end of each of the first and second arms is attached to a respective anchor affixed to the substrate. Second ends of the first and second arms are mechanically connected to one another. The first arm comprises (i) a first thermal expansion layer and (ii) the first resistive heater, wherein the first resistive heater is different from the first thermal expansion layer. The first resistive heater is adapted to increase the temperature of the first thermal expansion layer in response to the first electrical current. The first thermal expansion layer is adapted to expand in response to the temperature increase induced by the first resistive heater and move the second ends of the first and second arms with respect to the substrate due to said expansion of the first thermal expansion layer.

BRIEF DESCRIPTION OF THE DRAWINGS

Other aspects, features, and benefits of the present invention will become more fully apparent from the following detailed description, the appended claims, and the accompanying drawings in which:

FIGS. 3A-C show a MEMS-based relay switch according to one embodiment of the invention.

DETAILED DESCRIPTION

Figure 1A:
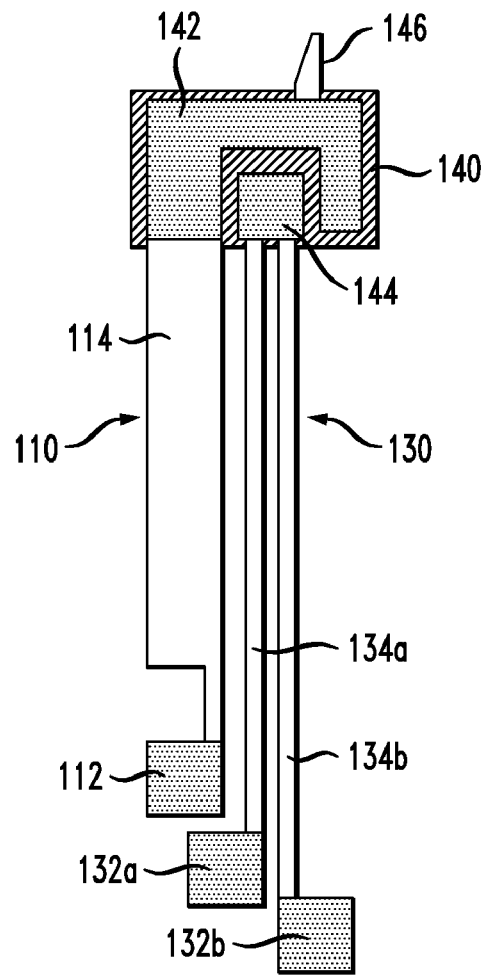
FIGS. 1A-B show top views of a prior-art MEMS-based thermal actuator in "cold" and "hot" states, respectively.
Figure 1B:
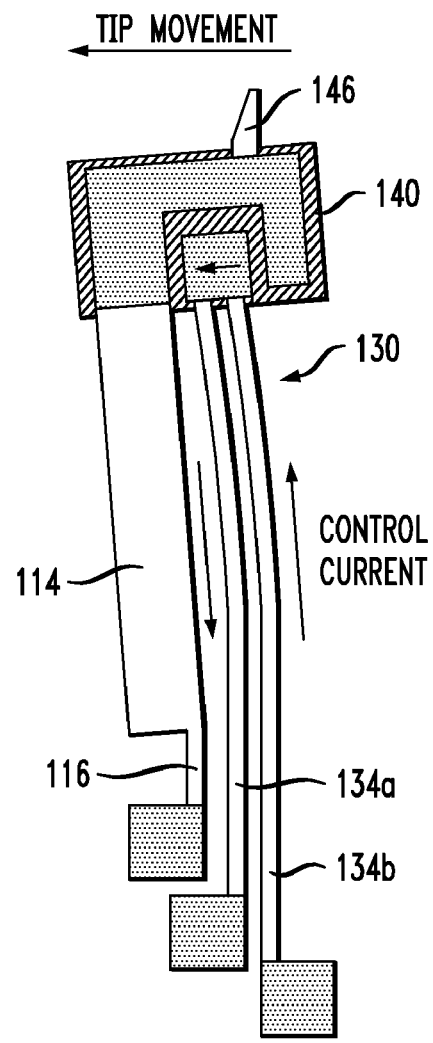

FIGS. 1A-B show top views of a prior-art MEMS-based thermal actuator 100 in "cold" and "hot" states, respectively. Actuator 100 has two cantilevered arms 110 and 130, each anchored to a substrate at one end and linked to the other arm at the other end. The plane of the substrate is parallel to the plane of FIGS. 1A-B. Arm 110 is a "passive" arm that is attached to the substrate at an anchor 112. Arm 110 is (i) generally parallel to the substrate, (ii) detached from the substrate along the arm's length, and (iii) movable with respect to the substrate. Arm 130 is an "active" arm that has two beams 134a-b. Each of beams 134a-b is (i) generally parallel to the substrate, (ii) attached at one end to a respective one of anchors 132a-b, each of which is similar to anchor 112, (iii) detached from the substrate along the beam's length, and (iv) movable with respect to the substrate.

Arms 110 and 130 are mechanically connected to one another by a suspended dielectric tether 140. Tether 140 is movable with respect to the substrate and supports two conducting structures 142 and 144 that are electrically isolated from one another by a trench between them and due to the fact that the tether does not conduct electricity. Structure 142 electrically connects a beam 114 of arm 110 to a tip 146 to create a continuous electrical path between anchor 112 and the tip. Structure 144 electrically interconnects beams 134a-b of arm 130 to create a continuous electrical path between anchors 132a-b.

Each of beams 134a-b is typically made of a nickel alloy or other suitable electrically conducting material having a relatively large thermal expansion coefficient. If a control current is passed through arm 130 between anchors 132a-b (see FIG. 1B), then the current resistively heats up beams 134a-b. The resulting thermal expansion of beams 134a-b causes the beams to bow, thereby bending a neck portion 116 of beam 114 and moving tether 140 and tip 146 with respect to the substrate as shown in FIG. 1B. If the control current is turned OFF, then beams 134a-b cool down and contract, thereby returning tip 146 to the initial position shown in FIG. 1A.

Figure 2A:
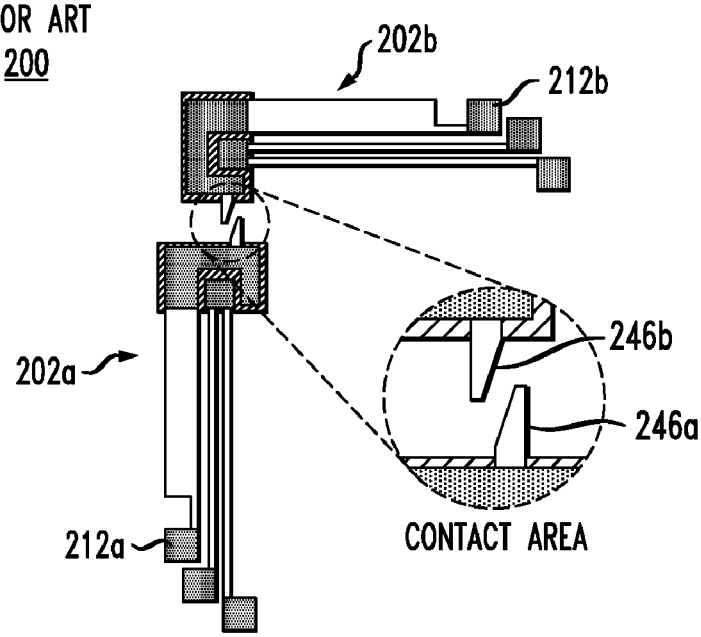
FIGS. 2A-D show top views of a prior-art relay switch having two thermal actuators, each of which is analogous to the thermal actuator shown in FIG. 1.
Figure 2B:
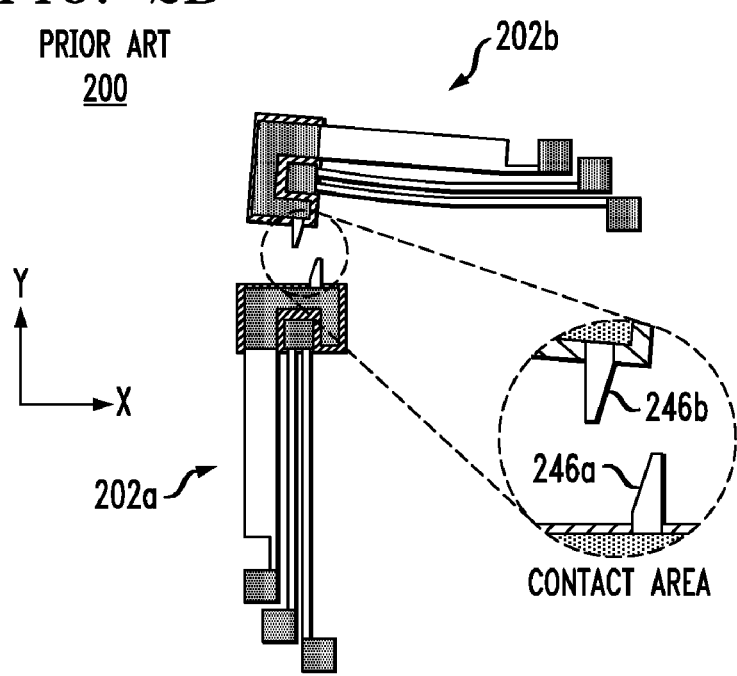
Figure 2C:
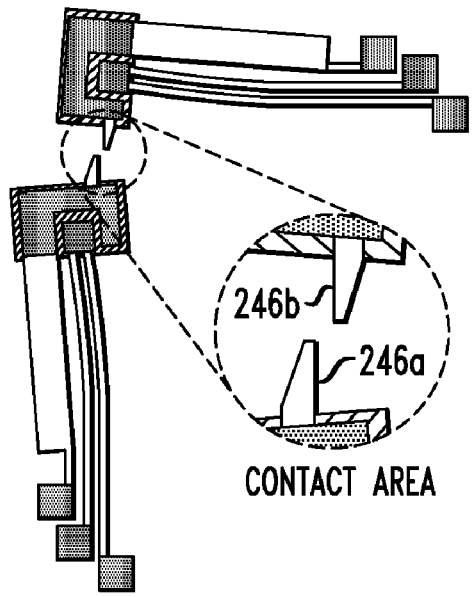
Figure 2D:
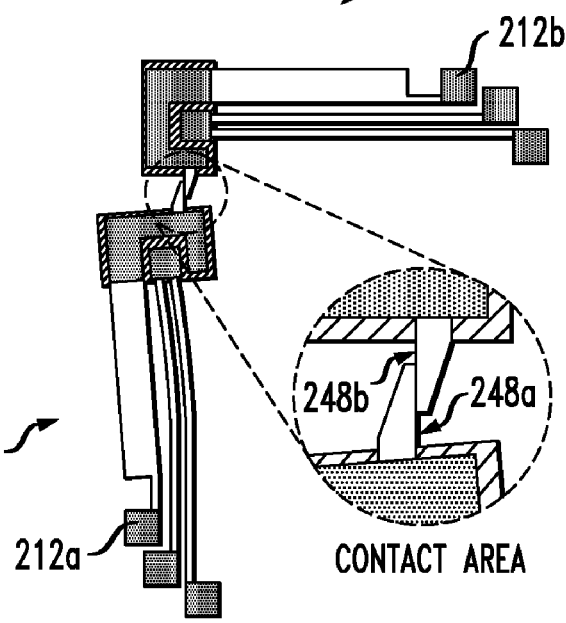

FIGS. 2A-D show top views of a prior-art relay switch 200 having two thermal actuators 202a-b, each of which is analogous to thermal actuator 100 of FIG. 1. More specifically, FIGS. 2A and 2D show switch 200 in OFF and ON states, respectively. FIGS. 2B-C show two transition configurations of switch 200 between the OFF state shown in FIG. 2A and the ON state shown in FIG. 2D. The circular insets in each of FIGS. 2A-D show respective enlarged views of the contact area of switch 200 having tips 246a-b of actuators 202a-b, respectively.

If no currents flow through the "active" arms of actuators 202a-b, then tips 246a-b are separated from one another by an air gap, as shown in FIG. 2A. Because of the air gap, there is no continuous electrical path between anchors 212a-b, and switch 200 is in the OFF state. To transition switch 200 to an ON state, first, a first control current is driven through the "active" arm of actuator 202b. The resulting heating and deformation of that "active" arm causes a displacement of tip 246b of actuator 202b in the positive Y direction, as shown in FIG. 2B. Second, a second control current is driven through the "active" arm of actuator 202a. The resulting heating and deformation of that "active" arm causes a displacement of tip 246a of actuator 202a in the negative X direction, as shown in FIG. 2C. Third, the first control current is turned OFF, which causes the "active" arm of actuator 202b to cool down and return tip 246b to the initial position. Finally, the second control current is turned OFF. As the "active" arm of actuator 202a cools down, it attempts to return tip 246a to its initial position. However, tip 246b now blocks the return path of tip 246a. As a result, the contracting "active" arm of actuator 202a pushes a surface 248a of tip 246a against a corresponding surface 248b of tip 246b to interlock the two tips as shown in FIG. 2D. After tips 246a-b have interlocked, the air gap between the tips has closed to create a continuous electrical path between anchors 212a-b. Thus, switch 200 is now in the ON state. Note that no control currents are needed to keep switch 200 in the ON state because the elastic return force generated by actuator 202a is substantially orthogonal to surfaces 248a-b. Consequently, the return force lacks a tangential component that is needed to disengage surfaces 248a-b from one another.

To transition switch 200 back to the OFF state, the above-described sequence is performed in the reverse order. More specifically, first, the second control current is turned ON to move tip 246a in the negative X direction from the position shown in FIG. 2D. Second, the first control current is turned ON to move tip 246b in the positive Y direction to arrive at the configuration shown in FIG. 2C. Third, the second control current is turned OFF to arrive at the configuration shown in FIG. 2B. Finally, the first control current is turned OFF to arrive at the configuration shown in FIG. 2A, which represents an OFF state of switch 200. More details on the structure and operation of switch 200 can be found, e.g., in U.S. Pat. No. 6,407,478, which is incorporated herein by reference in its entirety.

One problem with actuator 100 and switch 200 is that the material of an "active" arm, e.g., arm 130 (FIG. 1), performs two functions. First, the material serves as an electric conductor and resistive heater for the "active" arm. Second, the material serves as a mechanical elastic member that flexes, expands, and contracts to generate the desired tip displacements. Due to this dual functionality, the mechanical and electrical properties of the "active" arm cannot be optimized independently. For example, if beams 134a-b are made of a nickel alloy, then the beams have good thermal expansion and elastic characteristics, but relatively low electrical resistance. As a result, a relatively high control current has to be applied to "active" arm 130 to resistively heat the arm to a temperature that is sufficient, e.g., for implementing the configuration sequence shown in FIGS. 2A-D. The relatively high control currents might disadvantageously cause the power consumption in switch 200 to be relatively high. In addition, the relatively low electrical resistance of the "active" arms forces the use of special low-resistance wiring for feeding the control currents to the "active" arms because, otherwise, the wiring becomes disadvantageously hot as well.

Problems in the prior art are addressed by embodiments of a thermal actuator of the present invention, in which electrical and mechanical characteristics of an "active" arm are controlled by two separate structures. The first structure primarily functions as a resistive heater for the "active" arm, without significantly affecting the mechanical characteristics of the arm. The second structure primarily functions as a mechanical elastic member that does not affect the electrical characteristics of the arm. Advantageously over the prior art, the mechanical and electrical properties of the "active" arm can now be optimized independently. As a result, switch designers have more flexibility to attain desired switch characteristics.

Figure 3B:
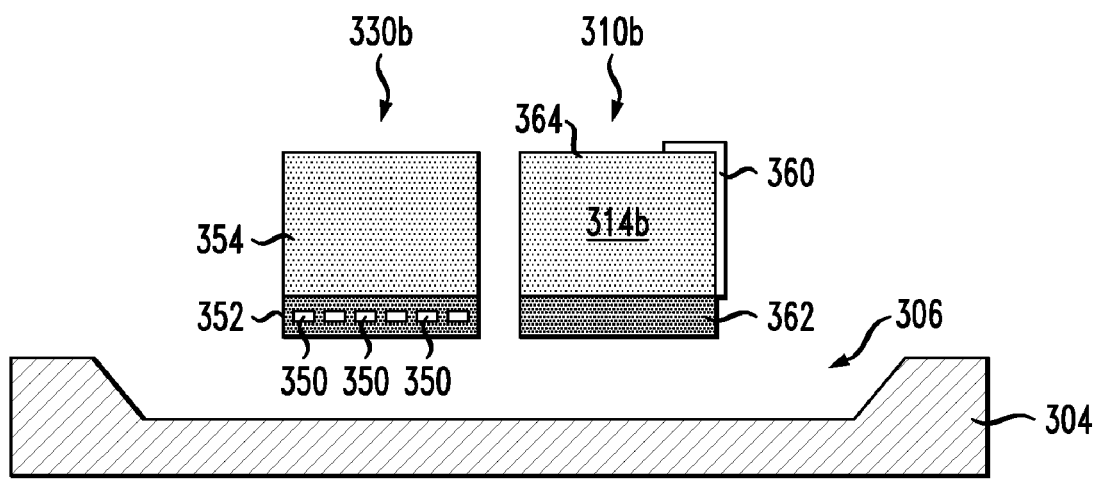
Figure 3C:
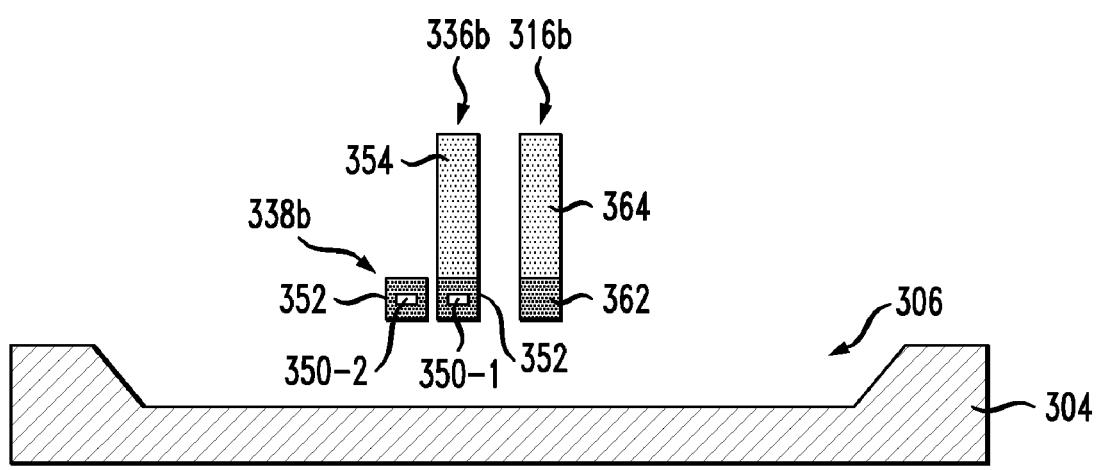

FIGS. 3A-C show a MEMS-based relay switch 300 according to one embodiment of the invention. More specifically, FIG. 3A shows a top view of switch 300, and FIGS. 3B-C show cross-sectional side views of the switch along the planes labeled BB and CC, respectively, in FIG. 3A.

Referring to FIG. 3A, switch 300 has two thermal actuators 302a-b that are oriented substantially orthogonally to one another. To display a sufficiently detailed view of the actuator structure, FIG. 3A shows thermal actuator 302b in full, while showing thermal actuator 302a only partially. The omitted portion of actuator 302a is similar to the corresponding portion of actuator 302b.

Each of actuators 302a-b has a respective cantilevered "passive" arm 310 and a respective cantilevered "active" arm 330. Arm 310 is attached to a substrate 304 at an anchor 312, and arm 330 is attached to substrate 304 at two anchors 332. Each of arms 310 and 330 is (i) generally parallel to substrate 304 (also see FIGS. 3B-C), (ii) detached from the substrate along the arm's length, and (iii) movable with respect to the substrate. Arms 310 and 330 are mechanically connected to one another by a tether 340. Tether 340 supports structures 342 and 344 that are separated from one another by a trench between them. Structure 342 is an electrically conducting structure that electrically connects a beam 314 of arm 310 to a tip 346 to create a continuous electrical path between anchor 312 and the tip. Structure 344 can be made of an electrically conducting material or a dielectric material and primarily serves to anchor arm 330 to tether 340.

Referring to FIGS. 3A-C, arm 330 has a dielectric layer 352 and a thermal-expansion layer 354. In one embodiment, layer 354 is made of a nickel alloy and is generally similar to beam 134 of actuator 100. Layer 352 is a dielectric layer that encapsulates a resistive heater 350 and electrically isolates the heater from layer 354. In one embodiment, layer 352 is made of silicon nitride, and heater 350 is made of polysilicon.

Heater 350 is a relatively narrow conducting track that electrically connects two respective anchors 332 (see FIG. 3A). In the embodiment of FIG. 3, electrical heater 350 has a switchback-shaped part, which enables the length of the heater to be about six times (6x) longer than the length of arm 330. One skilled in the art will understand that other conducting track layouts for heater 350 can similarly be used to obtain a desired track length. In prior-art "active" arm 130 (FIG. 1), bodies of beams 134a-b form a conducting track. The length of that conducting track is about two times the distance between the two opposite ends of arm 130, e.g., the first end being structure 144 and the second end being at anchors 132a-b, and this relationship between the length of the conducting track and the length of the arm is fixed. In contrast, a switch designer can change the length of the conducting track for heater 350 with respect to the length of arm 330. More specifically, depending on the number of switchbacks in the switchback-shaped part of the conducting track, the length of the conducting track can be about 2×, 4×, 6×, 8×, etc., the length of arm 330.

Arm 310 has an optional dielectric layer 362 and a conducting layer 364. In one embodiment, layers 352 and 362 can be made of the same material, e.g., from a common layer of a multi-layered wafer. Layers 354 and 364 can similarly be made of the same material, e.g., from another common layer of the multi-layered wafer. Arm 310 may optionally have an electrically conductive coating 360, e.g., made of gold, which serves to improve electrical conductivity of the arm.

Referring to FIGS. 3A and 3C, arm 310 has a neck portion 316 that enables that arm to deflect relatively easily when arm 330 thermally expands. Arm 330 also has a neck portion 336 that enables that arm to bow/bend when it is heated by heater 350. Similar to other portions of arm 330, neck portion 336 has layers 352 and 354. The portion of layer 352 corresponding to neck portion 336 passes through a single section, i.e., section 350-1, of heater 350. Arm 330 further has a suspended wire 338 that is part of heater 350. More specifically, wire 338 has section 350-2 of heater 350 encapsulated by the corresponding portion of layer 352. Together, heater section 350-1 and wire 338 provide electrical leads from anchors 332 to the switchback-shaped part of heater 350. In one embodiment, suspended wire 338 can be strain-relieved by having, e.g., a serpentine shape.

FIG. 3A shows an OFF state of switch 300. To transition switch 300 into an ON state, the switch is stepped through a configuration sequence that is similar to the configuration sequence shown in FIGS. 2A-D. More specifically, first, a first control current is driven through heater 350b of actuator 302b to move tip 346b in the negative Y direction. Second, a second control current is driven through heater 350a of actuator 302a to move tip 346a in the positive X direction. Third, the first control current is turned OFF to return tip 346b into the initial position shown in FIG. 3A. Finally, the second control current is turned OFF to latch tips 346a and 346b. One skilled in the art will understand that a reverse configuration sequence will transition switch 300 from the ON state to the OFF state.

FIGS. 4A-E illustrate representative fabrication steps for a MEMS-based switch 400 according to one embodiment of the invention. More specifically, each of FIGS. 4A-E shows a cross-sectional side view of a multilayered wafer, using which switch 400 is being fabricated, at the corresponding fabrication step. Each of the cross-sectional views is similar to the cross-sectional view of switch 300 shown in FIG. 3B.

Figure 4A:
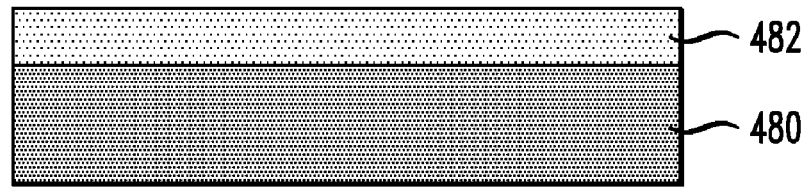
FIGS. 4A-E illustrate representative fabrication steps for a MEMS-based relay switch according to one embodiment of the invention.

Referring to FIG. 4A, fabrication of switch 400 begins with a silicon substrate 480. First, a sacrificial silicon oxide layer 482 is deposited over substrate 480. Then, layer 482 is patterned and etched to form openings (not explicitly shown in FIG. 4A), e.g., for forming anchors analogous to anchors 312 and 332 of FIG. 3.

Figure 4B:
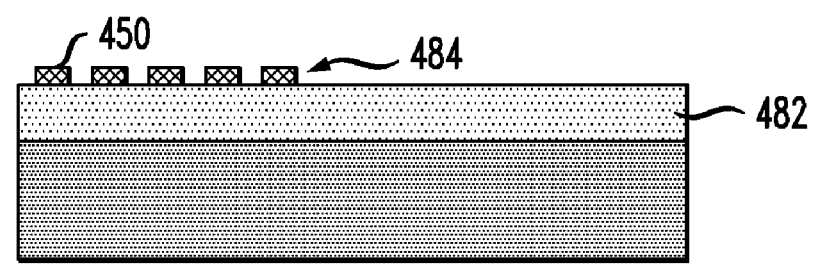

Referring to FIG. 4B, first, a poly-silicon layer 484 is deposited over layer 482. Layer 484 is then patterned and etched to form a heater 450 analogous to heater 350 of FIG. 3.

Figure 4C:
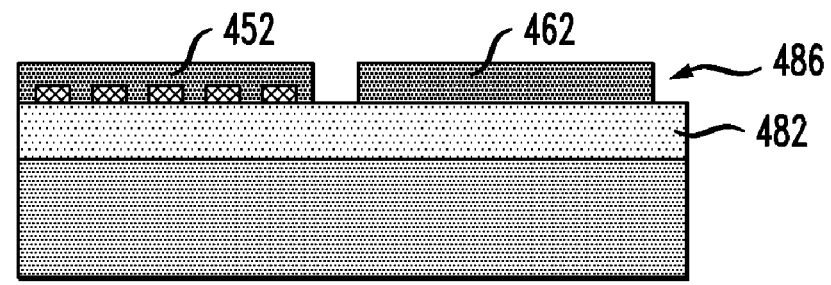

Referring to FIG. 4C, first, a silicon-nitride layer 486 is deposited over the structure of FIG. 4B. Layer 486 is then patterned and etched according to the layout of thermal actuators of switch 400. The corresponding portions of layer 486 form layers 452 and 462 of the actuator arms analogous to layers 352 and 362, respectively, of FIG. 3.

Figure 4D:
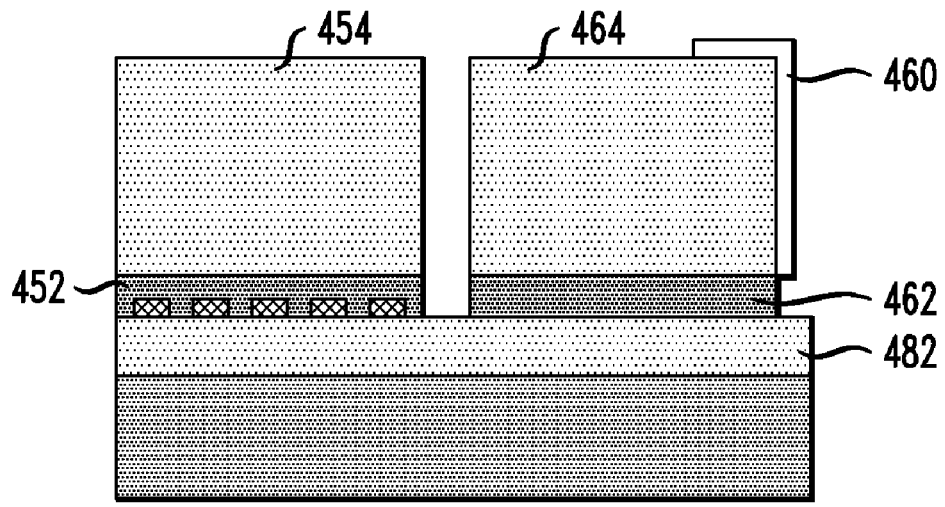

Referring to FIG. 4D, first, nickel-alloy layers 454 and 464 are electroplated over layers 452 and 462, respectively. Layers 454 and 464 are generally analogous to layers 354 and 364 of FIG. 3. Then, a gold layer 460 is deposited over layer 464. Layer 460 is generally analogous to layer 360 of FIG. 3.

Figure 4E:
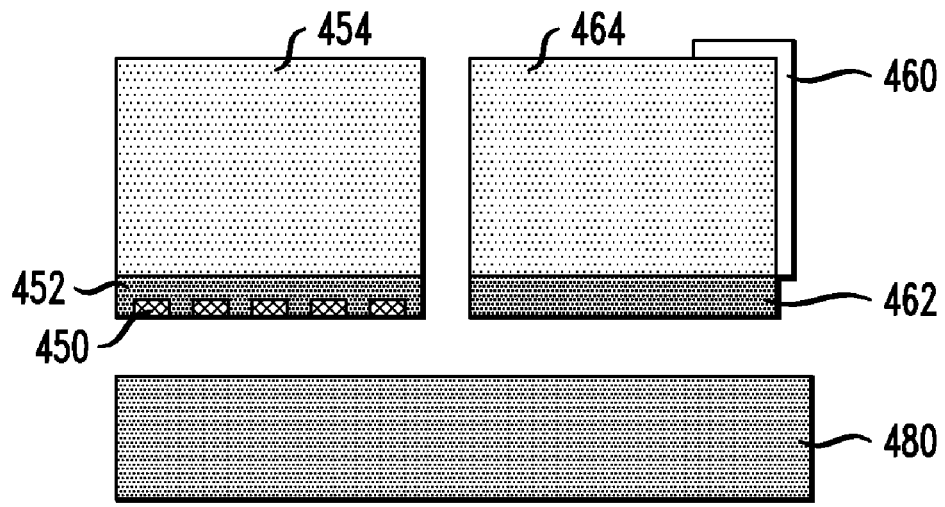

Referring to FIG. 4E, sacrificial layer 482 is removed (e.g., etched away) from the structure shown in FIG. 4D to arrive at the final structure of switch 400. Note that, unlike layer 352 of switch 300, which fully encapsulates heater 350, layer 452 of switch 400 encapsulates heater 450 only partially. Full encapsulation of the heater would be required if a trench similar to trench 306 (see, e.g., FIG. 3B) had to be formed in silicon substrate 480. Otherwise, the reactants that etch the trench in substrate 480 would also etch away the exposed material of heater 450, also made of silicon. A trench similar to trench 306 may be useful for improving thermal isolation of the "active" arm from the substrate and expanding the accessible temperature range for the "active" arm with respect to that in the structure without such a trench.

Other suitable fabrication techniques that can be used for fabricating relay switches of the invention are disclosed, e.g., in commonly owned U.S. Pat. Nos. 6,850,354 and 6,924,581, the teachings of which are incorporated herein by reference. Additional layers of material may be deposited using, e.g., chemical vapor deposition. Various parts of the switches may be mapped onto the corresponding layers using lithography. Additional description of various fabrication steps may be found, e.g., in U.S. Pat. Nos. 6,201,631, 5,629,790, and 5,501,893, the teachings of all of which are incorporated herein by reference. Representative fabrication-process flows can be found, e.g., in U.S. Pat. Nos. 6,667,823, 6,876,484, 6,980,339, 6,995,895, and 7,099,063 and U.S. patent application Ser. No. 11/095,071 (filed on Mar. 31, 2005), the teachings of all of which are incorporated herein by reference.

While this invention has been described with reference to illustrative embodiments, this description is not intended to be construed in a limiting sense. For example, a heater can be made of other Si compounds, such as SiGe and metal silicides; a thermal expansion can be made of metals, such as Cu and Tungsten and their alloys; and a heater-encapsulating layer can be made of silicon oxide or polymers, such as polyimide and benzocyclobutene (BCB). Various surfaces may be modified, e.g., by metal deposition for enhanced electrical conductivity, or by ion implantation for enhanced mechanical strength. Differently shaped arms, tethers, beams, latches, heaters, and/or anchors may be implemented without departing from the scope and principle of the invention. Various modifications of the described embodiments, as well as other embodiments of the invention, which are apparent to persons skilled in the art to which the invention pertains are deemed to lie within the principle and scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the invention. The use of terms such as height, length, width, left, right, top, bottom is strictly to facilitate the description of the invention and is not intended to limit the invention to a specific orientation.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, Microsystems, and devices produced using microsystems technology or microsystems integration.

Although the present invention has been described in the context of implementation as MEMS devices, the present invention can in theory be implemented at any scale, including scales larger than micro-scale.

Also for purposes of this description, the terms "connect," "connecting," or "connected" refer to any manner known in the art or later developed in which a particular type of energy (e.g., electrical or mechanical) is allowed to be transferred between two or more elements, and the interposition of one or more additional elements is contemplated, although not required. Conversely, the term "directly connected," etc., imply the absence of such additional elements.

What is claimed is:

1. A device, comprising: first and second arms movably supported on a substrate, wherein:
    a first end of each of the first and second arms is attached to a respective anchor affixed to the substrate;
    second ends of the first and second arms are mechanically connected to one another;
    the first arm comprises (i) a first thermal expansion layer having a large thermal expansion coefficient and (ii) a first resistive heater that is different and separate from the first thermal expansion layer, wherein the first resistive heater is electrically isolated from the first thermal expansion layer and from the second arm;
    the first resistive heater is adapted to increase a temperature of the first thermal expansion layer in response to a first electrical current driven through the first resistive heater, wherein the electrical isolation prevents the first electrical current from flowing through the first thermal expansion layer;
    the first thermal expansion layer is adapted to expand in response to the temperature increase induced by the first resistive heater and move the second ends of the first and second arms with respect to the substrate due to said expansion of the first thermal expansion layer; and
    the first arm comprises:
        a body portion that is movable with respect to the substrate, said body portion having a first cross-section;
        a neck portion that is movable with respect to the substrate, said neck portion having a second cross-section different from the first cross-section, wherein:
            the neck portion is located between the body portion and the first end of the first arm;
            the body portion is located between the neck portion and the second end of the first arm; and
            the neck portion comprises a first section and a second section that are separated by a gap between them; and
        a dielectric layer that at least partially encapsulates the first resistive heater to provide said electrical isolation, wherein:
            the first section has a portion of the dielectric layer and a portion of the first thermal expansion layer; and
            the second section has a portion of the dielectric layer but does not have a portion of the first thermal expansion layer.

2. The device of claim 1, wherein:
the first thermal expansion layer is an electrically conducting layer that comprises a first material; and
the first resistive heater comprises a second material different from the first material.

3. The device of claim 2, wherein:
the first material comprises nickel; and
the second material comprises silicon.

4. The device of claim 1, wherein:
at least a portion of the dielectric layer is located between the first resistive heater and the first thermal expansion layer to separate the first resistive heater from the first thermal expansion layer.

5. The device of claim 4, wherein the dielectric layer comprises silicon nitride.

6. The device of claim 4, wherein:
the dielectric layer is adjacent to the first thermal expansion layer; and
a side of the dielectric layer that is proximal to the substrate is located closer to the substrate than a side of the first thermal expansion layer that is proximal to the substrate.

7. The device of claim 1, wherein:
the first resistive heater comprises a conducting track having a length; and
said length is at least about four times (4×) larger than a distance between the first and second ends of the first arm.

8. The device of claim 7, wherein the conducting track has a switchback-shaped portion.

9. The device of claim 1, further comprising:
third and fourth arms movably supported on the substrate, wherein:
    a first end of each of the third and fourth arms is attached to a respective anchor affixed to the substrate;
    second ends of the third and fourth arms are mechanically connected to one another;
    the third arm comprises (i) a second thermal expansion layer and (ii) a second resistive heater that is different from the second thermal expansion layer;
    the second resistive heater is adapted to increase temperature of the second thermal expansion layer in response to a second electrical current driven through the second resistive heater; and
    the second thermal expansion layer is adapted to expand in response to the temperature increase induced by the second resistive heater and move the second ends of the third and fourth arms with respect to the substrate due to said expansion of the second thermal expansion layer.

10. The device of claim 9, further comprising:
a first tether that mechanically connects the second ends of the first and second arms, wherein:
the first tether supports a first conducting structure having a first tip; and
the second arm electrically connects (i) the anchor, to which the first end of the second arm is attached, and (ii) the first conducting structure; and
a second tether that mechanically connects the second ends of the third and fourth arms, wherein:
the second tether supports a second conducting structure having a second tip;
the fourth arm electrically connects (i) the anchor, to which the first end of the fourth arm is attached, and (ii) the second conducting structure; and
in response to the first and second electrical currents, the device is adapted to move the first and second tips with respect to the substrate to electrically connect the anchor, to which the first end of the second arm is attached, and the anchor, to which the first end of the fourth arm is attached.

11. The device of claim 10, wherein the first and second tips are adapted to interlock and maintain the electrical connection between the anchor, to which the first end of the fourth arm is attached, and the anchor, to which the first end of the second arm is attached, after the first and second electrical currents are removed.

12. The device of claim 1, wherein:
a side of the first thermal expansion layer that is proximal to the substrate is located at a first offset distance with respect to the substrate; and
a side of the first resistive heater that is proximal to the substrate is located at a different second offset distance with respect to the substrate.

13. The device of claim 1, wherein:
the first section provides a first electrical lead to the first resistive heater; and
the second section provides a second electrical lead to the first resistive heater, wherein a voltage differential between the first and second electrical leads causes the first electrical current to flow through the first resistive heater.

14. The device of claim 1, wherein the first resistive heater comprises a conducting track having a switchback-shaped portion located in the body portion of the first arm.

15. A method of operating a device, comprising the step of:
driving a first electrical current through a first resistive heater, wherein:
the device comprises first and second arms movably supported on a substrate;
a first end of each of the first and second arms is attached to a respective anchor affixed to the substrate;
second ends of the first and second arms are mechanically connected to one another;
the first arm comprises (i) a first thermal expansion layer having a large thermal expansion coefficient and (ii) the first resistive heater, wherein the first resistive heater is different and separate from the first thermal expansion layer and wherein the first resistive heater is electrically isolated from the first thermal expansion layer and from the second arm;
the first resistive heater is adapted to increase a temperature of the first thermal expansion layer in response to the first electrical current, wherein the electrical isolation prevents the first electrical current from flowing through the first thermal expansion layer;
the first thermal expansion layer is adapted to expand in response to the temperature increase induced by the first resistive heater and move the second ends of the first and second arms with respect to the substrate due to said expansion of the first thermal expansion layer; and
the first arm comprises:
a body portion that is movable with respect to the substrate, said body portion having a first cross-section;
a neck portion that is movable with respect to the substrate, said neck portion having a second cross-section different from the first cross-section, wherein:
the neck portion is located between the body portion and the first end of the first arm;
the body portion is located between the neck portion and the second end of the first arm; and
the neck portion comprises a first section and a second section that are separated by a gap between them; and
a dielectric layer that at least partially encapsulates the first resistive heater to provide said electrical isolation, wherein:
the first section has a portion of the dielectric layer and a portion of the first thermal expansion layer; and
the second section has a portion of the dielectric layer but does not have a portion of the first thermal expansion layer.

16. The method of claim 15, wherein:
at least a portion of the dielectric layer is located between the first resistive heater and the first thermal expansion layer to separate the first resistive heater from the first thermal expansion layer.

17. The method of claim 15, further comprising the step of:
driving a second electrical current through a second resistive heater, wherein:
the device further comprises third and fourth arms movably supported on the substrate;
a first end of each of the third and fourth arms is attached to a respective anchor affixed to the substrate;
second ends of the third and fourth arms are mechanically connected to one another;
the third arm comprises (i) a second thermal expansion layer and (ii) the second resistive heater, wherein the second resistive heater is different from the second thermal expansion layer;
the second resistive heater is adapted to increase temperature of the second thermal expansion layer in response to the second electrical current; and
the second thermal expansion layer is adapted to expand in response to the temperature increase induced by the second resistive heater and move the second ends of the third and fourth arms with respect to the substrate due to said expansion of the second thermal expansion layer.

18. The method of claim 16, wherein the device further comprises:
a first tether that mechanically connects the second ends of the first and second arms, wherein:
the first tether supports a first conducting structure having a first tip; and the second arm electrically connects (i) the anchor, to which the first end of the second arm is attached, and (ii) the first conducting structure; and a second tether that mechanically connects the second ends of the third and fourth arms, wherein:

the second tether supports a second conducting structure having a second tip;

the fourth arm electrically connects (i) the anchor, to which the first end of the fourth arm is attached, and (ii) the second conducting structure; and the method comprises the step of moving the first and second tips with respect to the substrate in response to the first and second electrical currents to electrically connect the anchor, to which the first end of the second arm is attached, and the anchor, to which the first end of the fourth arm is attached.

19. The method of claim 18, further comprising the steps of:

removing the first electrical current; and removing the second electrical current, wherein, in response to said current removals, the device moves the first and second tips with respect to the substrate so as to interlock said tips and provide an electrical connection between the anchor, to which the first end of the fourth arm is attached, and the anchor, to which the first end of the second arm is attached.

20. The method of claim 19, further comprising the steps of:

sequentially turning ON the first and second electrical currents to unlock the first and second tips and electrically disconnect the anchor, to which the first end of the fourth arm is attached, and the anchor, to which the first end of the second arm is attached; and sequentially removing the first and second electrical currents.

21. The method of claim 15, wherein the first arm comprises:

a first portion having a first cross-section and a second portion having a second cross-section different from the first cross-section, wherein the first portion is connected between a first anchor and the second portion; and a suspended wire connected between a second anchor and the second portion, wherein the first portion and the wire serve as electrical leads for the first resistive heater, the method further comprising the step of applying a voltage differential between the first and second anchors to drive the first electrical current through the first resistive heater.

* * * * *